United States Patent [19]
Lee et al.

[11] Patent Number: 5,880,022
[45] Date of Patent: Mar. 9, 1999

[54] SELF-ALIGNED CONTACT WINDOW

[75] Inventors: Kuo-Hua Lee, Lower Macungie; Chen-Hua Douglas Yu, Allentown, both of Pa.

[73] Assignee: Lucent Technologies Inc., Murray Hill, N.J.

[21] Appl. No.: 815,316

[22] Filed: Dec. 30, 1991

[51] Int. Cl.$^6$ .................. H01L 21/336; H01L 21/441; H01L 23/522
[52] U.S. Cl. ............................. 438/639; 438/696
[58] Field of Search ................... 437/40, 41, 52, 437/228, 50; 357/236; 156/643; 438/639

[56] References Cited

U.S. PATENT DOCUMENTS

| | | | |
|---|---|---|---|
| 4,554,729 | 11/1985 | Tanimura et al. | 437/52 |
| 4,844,776 | 7/1989 | Lee et al. | 156/653 |
| 4,944,682 | 7/1990 | Cromn et al. | 437/228 |
| 4,981,810 | 1/1991 | Fazan et al. | 437/28 |
| 4,996,167 | 2/1991 | Chen | 437/40 |
| 4,997,790 | 3/1991 | Woo et al. | 437/195 |
| 5,025,295 | 6/1991 | Kuesters et al. | 357/23.6 |
| 5,026,666 | 6/1991 | Hills et al. | 437/228 |
| 5,037,777 | 8/1991 | Mele et al. | 437/195 |
| 5,049,517 | 9/1991 | Lou et al. | 437/228 |
| 5,073,510 | 12/1991 | Kwon et al. | 437/40 |
| 5,084,405 | 1/1992 | Fazan et al. | 437/228 |
| 5,114,879 | 5/1992 | Madan | 437/50 |

*Primary Examiner*—Olik Chaudhuri
*Assistant Examiner*—A. D. Mai
*Attorney, Agent, or Firm*—Richard D. Laumann

[57] ABSTRACT

A self aligned contact to the substrate in the region between two gate electrodes is formed by depositing a conformal dielectric layer and patterning to form a contact window. The conductive elements of the gate electrode are not contacted because of etch rate differentials between the conformal dielectric and the insulating elements of the gate structure.

5 Claims, 1 Drawing Sheet

SELF-ALIGNED CONTACT WINDOW

TECHNICAL FIELD

This invention relates generally to the field of integrated circuits having self-aligned electrical contacts.

BACKGROUND OF THE INVENTION

Most devices in present integrated circuits must be electrically contacted. For example, field effect transistors have source/drain regions and gate electrodes which are electrically contacted. As integrated circuits increase in complexity and the number and size of the devices increase and decrease, respectively, making such electrical contacts continues to become more difficult. The surface area available for the contacts becomes smaller and the necessity to avoid misalignment errors, which might inadvertently result in contacting the wrong portion of the surface, also dictates that small contacts be used. See, for example, U.S. Pat. No. 4,844,776 issued on Jul. 4, 1989 to K-H Lee, C-Y Lu and David Yaney for description of source/drain contacts above the source/drain regions.

Early lithographic patterning deposited a resist on a surface and selectively exposed portions of the resist to radiation, thereby altering the solubility of the resist when exposed to a suitable etching or developing agent. After the resist had been patterned to expose selected portions of the underlying material, the exposed portion of the material was removed by etching. In this format, etching is terminated after a predetermined time has elapsed or when another event, such as exposure of an underlying material, has occurred. The area of the contact so formed is identical to the area of the resist initially removed.

However, fabrication of contacts smaller than those defined in resist is frequently desirable and, to meet this desire, self-aligned contacts have been developed. In making such contacts, the size of the contact is smaller than the opening initially exposed in the resist because the etch ultimately exposes a material, covering a portion of the opening, which is relatively impervious to the etch. Only the remaining portion of the opening is etched.

One contact that is difficult to form at small dimensions, half micrometer and smaller, is the contact to the substrate between two gate electrodes or runners. The contact area is small and the contact must be formed without too much etching into the substrate or overetching of the gate electrode. The former might degrade the source/drain region and the latter might lead to electrical short circuits to the gate electrode if a conducting layer of the gate electrode is exposed by the etching process.

SUMMARY OF THE INVENTION

A method of integrated circuit manufacturing is described in which a self-aligned contact is formed to the substrate in the region between two gate electrodes. In addition to a conducting structure, the gate electrodes have insulating sidewalls and a insulating top layer. A layer of a conformal dielectric is deposited over the surface of the substrate and the gate electrodes and an opening, which is larger than the desired contact area, is defined in resist. A partial etch clears most of the conformal dielectric from the contact area but, because of etch rate differentials, does not expose the conducting structure of the gate electrode. The photoresist is stripped and a wet etch is used to remove any remaining conformal dielectric. A metal is deposited and patterned to define the contact which is termed a landing pad.

For reasons of clarity, the elements depicted are not drawn to scale.

DETAILED DESCRIPTION

Figure 1:
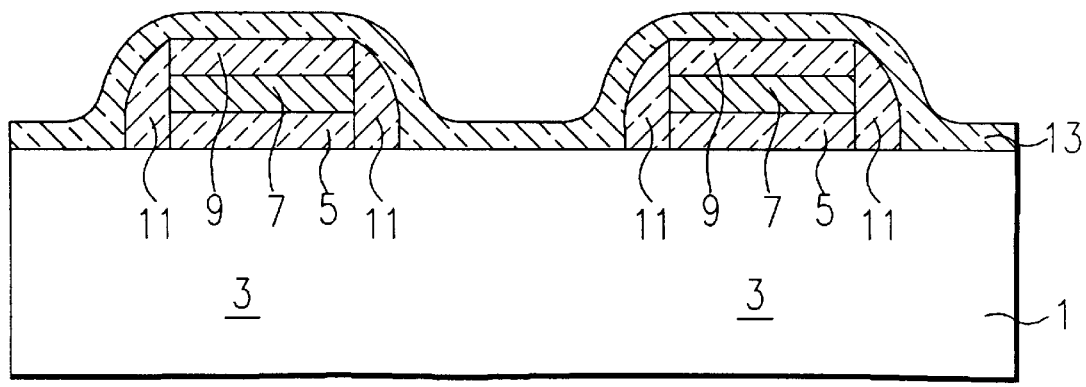
FIGS. 1–3 are sectional views of a portion of an integrated circuit at different of manufacture according to an embodiment of this invention.

Our invention will be described by reference to a particular embodiment. Depicted in FIG. 1 are substrate 1, gate structures 3 comprising gate oxide 5, conducting structure 7, insulating top layer 9, and dielectric sidewalls 11, and conformal dielectric layer 13. The term substrate is used to mean any material that lies underneath and supports another material. It thus includes a silicon wafer without or without an epitaxial layer. Additionally, the surface may have been modified by adding a dopant to change the conductivity of the material. The gate structure will be readily fabricated by those skilled in the art. The gate oxide will be readily fabricated. The conducting structure may comprise a silicide/polysilicon stack or it may be only a polysilicon layer, etc. The insulating top layer comprises a dielectric, typically an oxide or a nitride, with a relatively low wet etch rate. PETEOS (plasma enhanced TEOS) is an expedient choice, although those skilled in the art could select other compositions. The sidewalls are typically formed by depositing a dielectric layer and etching back to leave the sidewalls. The composition selected for the sidewalls should have a low wet etch rate. Typical compositions include silicon oxides and nitrides. The thicknesses are not critical and will be readily selected by those skilled in the art. The conformal dielectric layer 13 comprises an oxide or nitride that can be deposited conformally. An expedient choice is TEOS deposited by low pressure chemcial vapor deposition.

Figure 2:
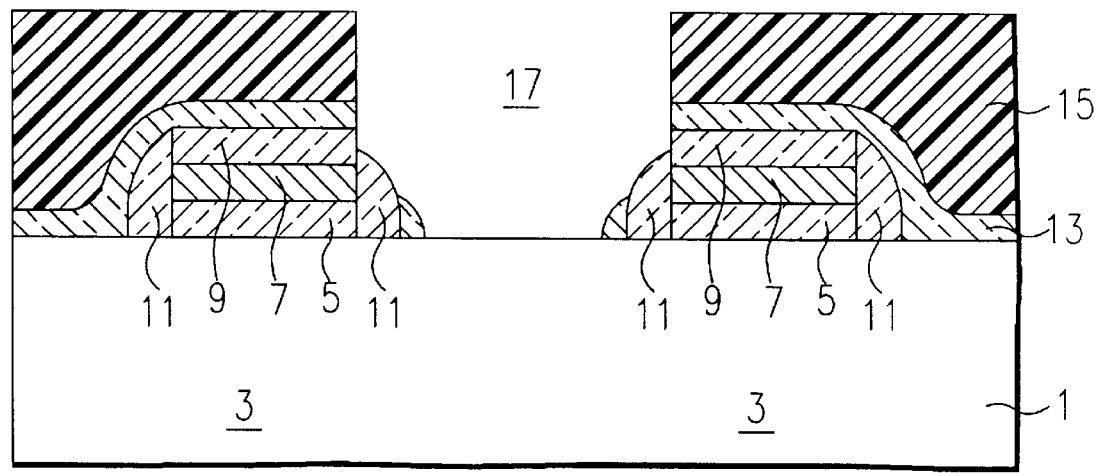

Further processing yields the structure depicted in FIG. 2. A layer of photoresist 15 is deposited. A photoresist is a layer of a material that, upon exposure to radiation, has differential removal rates when exposed to a suitable etch. Radiation means electromagnetic radiation or particle radiation such as electrons. The photoresist is patterned using standard lithographic patterning techniques to form window 17 which typically has the same horizontal dimension as the spacing between the gate structures 3. The conformal dielectric is now anisotropically etched until a portion of the substrate surface between the gate structures is cleared. It should be noted that a portion of the conformal dielectric layer on the sidewalls remains. This portion could be removed by the etch but desirably is not as complete removal might lead to a significant and undesirable over etch of the substrate.

Figure 3:
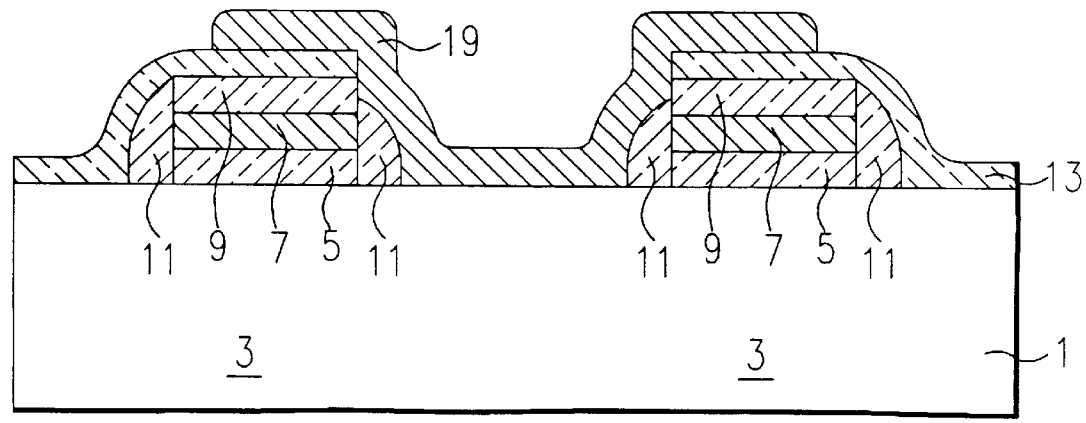

The photoresist is now stripped and the remaining portion of the conformal dielectric layer on the sidewalls removed by a brief exposure to an appropriate solvent. For example, an exemplary choice is dipping the entire wafer in 100:1 HF for approximately 2 minutes. The window metallization is desirably deposited immediately after this step to prevent any contamination of the surface from occurring. An exemplary material for the metallization is $WSi_2$. The metal may be blanket deposited and then patterned to form the landing pad. The resulting structure is depicted in FIG. 3. The step of exposing to the appropriate solvent is important because the initial etch may not remove all of the conformal dielectric layer between the gate electrodes. This material, if left, may significantly increase contact resistance because it reduces the contact area.

Additional processing completes the integrated circuit fabrication. Another dielectric layer is deposited and patterned to expose portions of the window pads and a contact metallization is deposited and patterned. These steps are well known to those skilled in the art and need not be further described.

Variations of the embodiment described will be readily thought of by those skilled in the art. For example, deposited dielectrics other than TEOS may be used.

We claim:

1. A method of integrated circuit manufacturing comprising the steps of:

forming a plurality of spaced apart gate electrodes, said electrodes comprising a conducting structure, an insulating top layer, and dielectric sidewalls;

depositing a layer of conformal dielectric, said layer contacting at least a portion of said gate electrodes and the substrate between the gate electrodes;

depositing a layer of photoresist;

forming openings in said photoresist which expose portions of said conformal dielectric between said gate structures, said openings being larger than the desired contact area;

etching at least a portion of said conformal dielectric layer to expose a portion of the substrate between said gate structures; and forming a landing pad contacting said substrate.

2. A method as recited in claim 1 comprising the further step of:

wet etching in a solvent after said etching step to remove the remaining exposed portions of said conformal dielectric.

3. A method as recited in claim 2 in which said wet etching uses IF.

4. A method as recited in claim 1 in which said conformal dielectric and said dielectric layers comprise at least one member selected from the group consisting of silicon oxides and nitrides.

5. A method as recited in claim 4 in which said silicon oxide comprises TEOS.

* * * * *